US011165136B2

(12) United States Patent
Ou et al.

(10) Patent No.: US 11,165,136 B2
(45) Date of Patent: Nov. 2, 2021

(54) FLEX INTEGRATED ANTENNA ARRAY

(71) Applicant: QUALCOMM Incorporated, San Diego, CA (US)

(72) Inventors: Yu-Chin Ou, San Diego, CA (US); Mohammad Ali Tassoudji, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 18 days.

(21) Appl. No.: 16/132,385

(22) Filed: Sep. 15, 2018

(65) Prior Publication Data
US 2020/0091581 A1   Mar. 19, 2020

(51) Int. Cl.
*H01Q 1/22*   (2006.01)
*H01Q 9/04*   (2006.01)
*H01Q 21/06*   (2006.01)
*H05K 1/18*   (2006.01)
*H05K 1/02*   (2006.01)
*H01L 23/66*   (2006.01)
*H01L 23/498*   (2006.01)

(52) U.S. Cl.
CPC ..... *H01Q 1/2283* (2013.01); *H01L 23/49816* (2013.01); *H01L 23/66* (2013.01); *H01Q 9/0407* (2013.01); *H01Q 21/065* (2013.01); *H05K 1/0243* (2013.01); *H05K 1/181* (2013.01); *H01L 2223/6677* (2013.01); *H05K 2201/10098* (2013.01); *H05K 2201/10378* (2013.01); *H05K 2201/10734* (2013.01)

(58) Field of Classification Search
CPC .. H01Q 1/2283; H01L 23/49816; H01L 23/66
See application file for complete search history.

(56) References Cited

U.S. PATENT DOCUMENTS

| 5,905,467 | A | 5/1999 | Narayanaswamy et al. |
| 7,262,737 | B2 | 8/2007 | Zarnowitz et al. |
| 9,548,525 | B2 | 1/2017 | Toh et al. |
| 2009/0143038 | A1* | 6/2009 | Saito ...................... H01Q 1/007 455/272 |
| 2010/0164783 | A1* | 7/2010 | Choudhury .............. H01Q 3/26 342/175 |
| 2014/0225805 | A1* | 8/2014 | Pan ......................... H01Q 21/24 343/893 |
| 2015/0097633 | A1* | 4/2015 | DeVries ................... H01L 23/66 333/33 |
| 2016/0178730 | A1 | 6/2016 | Trotta et al. |
| 2018/0084637 | A1* | 3/2018 | Ueda ........................ H01Q 1/38 |
| 2020/0014090 | A1* | 1/2020 | Jung ....................... H01L 23/66 |

FOREIGN PATENT DOCUMENTS

WO   2017052659 A1   3/2017

* cited by examiner

*Primary Examiner* — Daniel Munoz
(74) *Attorney, Agent, or Firm* — Hunter Clark PLLC

(57) ABSTRACT

Techniques are discussed herein for improving the form factor of a wideband antenna in a mobile device. An example of a wireless device according to the disclosure includes at least one radio frequency integrated circuit, a flex cable assembly operably coupled to the at least one radio frequency integrated circuit, and at least one radiator operably coupled to the flex cable assembly via at least one conductor in a ball grid array.

25 Claims, 11 Drawing Sheets

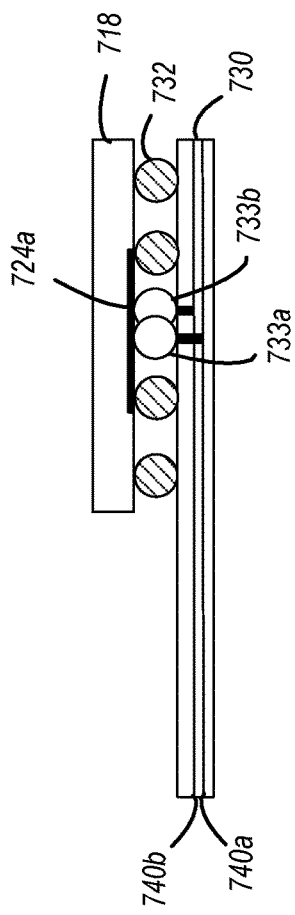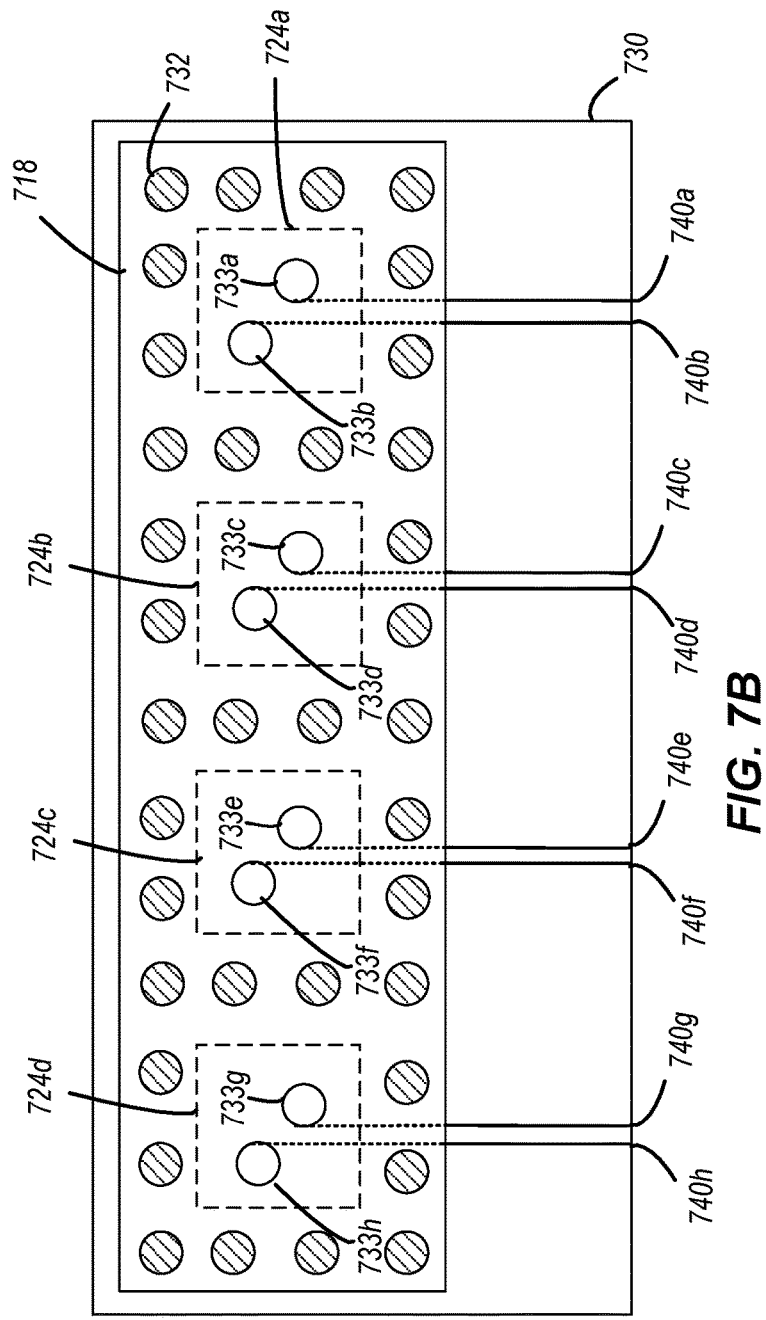
FIG. 7A
FIG. 7B

FLEX INTEGRATED ANTENNA ARRAY

BACKGROUND

A wireless device (e.g., a cellular phone or a smart phone) may include a transmitter and a receiver coupled to an antenna to support two-way communication. The antenna may be enclosed within a housing assembly (e.g., cover) based on portability and aesthetics design considerations. In general, the transmitter may modulate a radio frequency (RF) carrier signal with data to obtain a modulated signal, amplify the modulated signal to obtain an output RF signal having the proper power level, and transmit the output RF signal via the antenna to a base station. For data reception, the receiver may obtain a received RF signal via the antenna and may condition and process the received RF signal to recover data sent by the base station. As the radio frequency used by the wireless device increases, the complexity of the RF transmitting circuitry also increases. Larger processing circuits may be used to generate and control the high-frequency RF signals, but such increases in circuit dimensions may cause constraints in the form factor of a mobile device.

SUMMARY

An example of a wireless device according to the disclosure includes at least one radio frequency integrated circuit, a flex cable assembly operably coupled to the at least one radio frequency integrated circuit, and at least one radiator operably coupled to the flex cable assembly via at least one conductor in a ball grid array.

Implementations if such a wireless device may include one or more of the following features. The at least one radiator may be printed on an antenna carrier and the ball grid array may be configured to structurally couple the antenna carrier to the flex cable assembly. The at least one radiator may be printed on a device cover and the ball grid array may be configured to structurally couple the device cover to the flex cable assembly. The at least one radiator may be operably coupled to the flex cable assembly via a first conductor configured as a vertical-pol feed line, and a second conductor configured as a horizontal-pol feed line. One or more radiators may be operably coupled to the flex cable assembly via one or more conductors in at least one ball grid array. The one or more radiators may include a first array of radiators configured along a first geometric plane, and a second array of radiators configured along a second geometric plane angled with respect to the first geometric plane. The first array of radiators may be a backside array and the second array of radiators may be an end-fire array. The at least one radiator may be a metallic patch or a strip-shaped radiator. The flex cable assembly may be operably coupled to the at least one radio frequency integrated circuit and at least one printed circuit board. The at least one printed circuit board may include a recess and the at least one radio frequency integrated circuit may be disposed within the recess. The recess may be a cutout in the at least one printed circuit board and the at least one radio frequency integrated circuit may be disposed within the cutout.

An example of an antenna system according to the disclosure includes at least one radio frequency integrated circuit disposed in a first plane of a wireless device, a flex cable assembly operably coupled to the at least one radio frequency integrated circuit, and a first set of antenna elements formed on a second plane of the wireless device and operably coupled to the flex cable assembly, the first plane and the second plane being oriented in different spatial directions.

Implementations of such an antenna system may include one or more of the following features. The first set of antenna elements formed on the second plane of the wireless device may be operably coupled to the flex cable assembly via a first ball grid array. The first set of antenna elements may include a 1×4 patch antenna array. The first set of antenna elements may include a 2×2 patch antenna array. The first set of antenna elements may include one or more radiators and each of the one or more radiators is operably coupled to the flex cable assembly with at least two conductors. The at least two conductors may include a vertical-pol feed line and a horizontal-pol feed line. The antenna system may include a second circuit separate from the radio frequency integrated circuit and operably coupled thereto, such that the radio frequency circuit is configured to convert a signal between a millimeter-wave frequency and an intermediate frequency, and the second circuit is configured to convert a signal between the intermediate frequency and a baseband frequency. A second set of antenna elements may be formed on a third plane of the wireless device. The second set of antenna elements may be operably coupled to the flex cable assembly via a second ball grid array. The first set of antenna elements may be disposed on a first antenna carrier and the second set of antenna elements are disposed on a second antenna carrier. The first set of antenna elements or the second set of antenna elements may be disposed on an inside surface of a device cover.

An example of an apparatus according to the disclosure includes a printed circuit board, a circuit means for generating a radio signal, a flex cable means operably coupled to the circuit means and the printed circuit board, the circuit means being operably coupled, via the flex cable means, to processing means coupled to the printed circuit board, and at least one radiator means operably coupled to the flex cable means via at least one conductor means.

Implementations of such an apparatus may include one or more of the following features. The at least one radiator means may be printed on an antenna carrier and the conductor means may be configured to structurally couple the antenna carrier to the flex cable means. The at least one radiator means may be printed on a device cover means and the conductor means may be configured to structurally couple the device cover means to the flex cable means. The conductor means may include a first conductor configured as a vertical-pol feed line, and a second conductor configured as a horizontal-pol feed line. One or more radiator means may be operably coupled to the flex cable means via one or more conductor means. The one or more radiator means may include a first array of radiators configured along a first geometric plane, and a second array of radiators configured along a second geometric plane. The first array of radiators may be a backside array and the second array of radiators is an end-fire array.

Items and/or techniques described herein may provide one or more of the following capabilities, as well as other capabilities not mentioned. The design of a millimeter wave (MMW) module in a wireless device may be decoupled into two separate parts such as a low loss flex cable assembly and one or more antenna carriers. The flex cable assembly may be used as the carrier for radio frequency (RF) routing lines. The antenna carriers include at least one radiator which may be operably coupled to the flex cable. A device cover may be used as one or more antenna carrier. At least one ball grid array (BGA) may be used to simultaneously provide structure support and antenna alignment between the flex cable and the antenna carriers. The BGA may provide the means for probe feeding the one or more radiators. The flex cable enables the placement of dual-pol MMW arrays at the edge(s) of a wireless device. Other capabilities may be provided and not every implementation according to the disclosure must provide any, let alone all, of the capabilities discussed. Further, it may be possible for an effect noted above to be achieved by means other than that noted, and a noted item/technique may not necessarily yield the noted effect.

BRIEF DESCRIPTION OF THE DRAWINGS

FIGS. 7A and 7B show an example of a patch antenna array with a flex cable.

DETAILED DESCRIPTION

Techniques are discussed herein for improving the form factor of a wideband antenna in a mobile device. For example, many mobile devices include millimeter-wave (MMW) modules to support higher RF frequencies (e.g., 5th Generation specifications). These modules generally include a thick and multi-layered stack-up to support wideband antennas as well as the required signal and power routings to a Radio Frequency Integrated Circuit (RFIC). Current electronic manufacturing techniques create multiple layer integrated circuits (ICs), and each layer may include a high metal density which affects the antenna performance and increases the complexity of the device/circuit layout. Additionally, the dimensions of a MMW module may prevent an edge-fired configuration because the form factor of such a device may be thicker than current market expectations.

Figure 1:
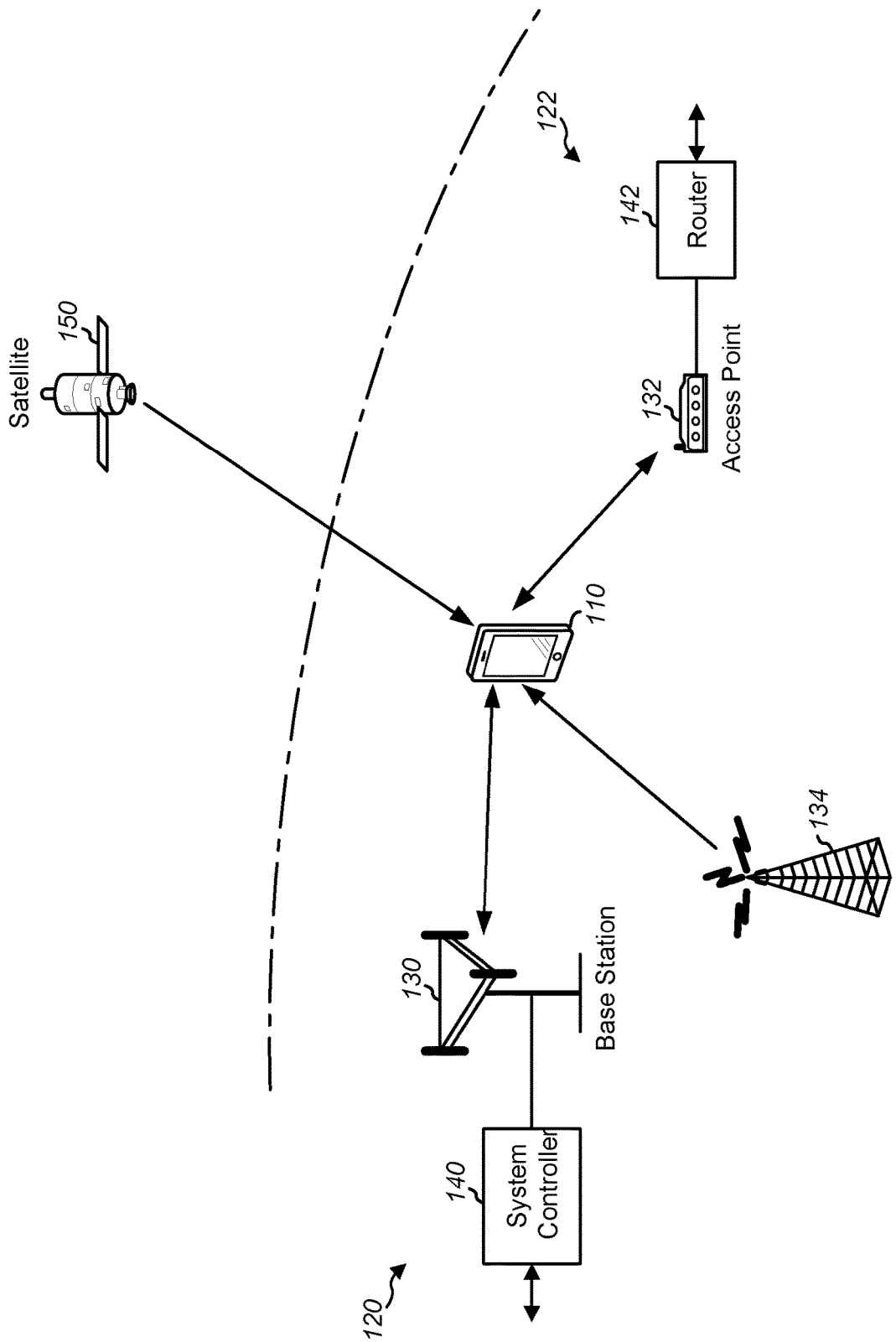
FIG. 1 shows a wireless device capable of communicating with different wireless communication systems.

Referring to FIG. 1, a wireless device 110 capable of communicating with different wireless communication systems 120 and 122 is shown. The wireless system 120 may be a Code Division Multiple Access (CDMA) system (which may implement Wideband CDMA (WCDMA), cdma2000, or some other version of CDMA), a Global System for Mobile Communications (GSM) system, a Long Term Evolution (LTE) system, a 5G system, etc. The wireless system 122 may be a wireless local area network (WLAN) system, which may implement IEEE 802.11, etc. For simplicity, FIG. 1 shows the wireless system 120 including a base station 130 and a system controller 140, and the wireless system 122 including an access point 132 and a router 142. In general, each system may include any number of stations and any set of network entities.

The wireless device 110 may also be referred to as a user equipment (UE), a mobile device, a mobile station, a terminal, an access terminal, a subscriber unit, a station, etc. The wireless device 110 may be a cellular phone, a smart phone, a tablet, a wireless modem, a personal digital assistant (PDA), a handheld device, a laptop computer, a smartbook, a netbook, a cordless phone, a wireless local loop (WLL) station, a Bluetooth device, etc. The wireless device 110 may be equipped with any number of antennas. Multiple antennas may be used to provide better performance, to simultaneously support multiple services (e.g., voice and data), to provide diversity against deleterious path effects (e.g., fading, multipath, and interference), to support multiple-input multiple-output (MIMO) transmission to increase data rate, and/or to obtain other benefits. The wireless device 110 may be capable of communicating with one or more wireless systems 120 and/or 122. The wireless device 110 may also be capable of receiving signals from broadcast stations (e.g., a broadcast station 134). The wireless device 110 may also be capable of receiving signals from satellites (e.g., a satellite 150), for example in one or more global navigation satellite systems (GNSS).

In general, the wireless device 110 may support communication with any number of wireless systems, which may employ any radio technologies such as WCDMA, cdma2000, LTE, GSM, 802.11, GPS, etc. The wireless device 110 may also support operation on any number of frequency bands.

The wireless device 110 may support operation at a very high frequency, e.g., within millimeter-wave (MMW) frequencies from 30 to 300 gigahertz (GHz). For example, the wireless device 110 may operate at 60 GHz for 802.11ad. The wireless device 110 may include an antenna system to support operation at MMW frequencies. The antenna system may include a number of antenna elements, with each antenna element being used to transmit and/or receive signals. The terms "antenna" and "antenna element" are synonymous and are used interchangeably herein. Generally, each set of antenna element may be implemented with a patch antenna or a strip-shaped radiators. A suitable antenna type may be selected for use based on the operating frequency of the wireless device, the desired performance, etc. In an exemplary design, an antenna system may include a number of patch and/or strip-type antennas supporting operation at MMW frequencies. Other radiator geometries and configurations may also be used. For example strip-shape antennas such as single-end fed, circular, and differential fed structures may be used.

Figure 2:
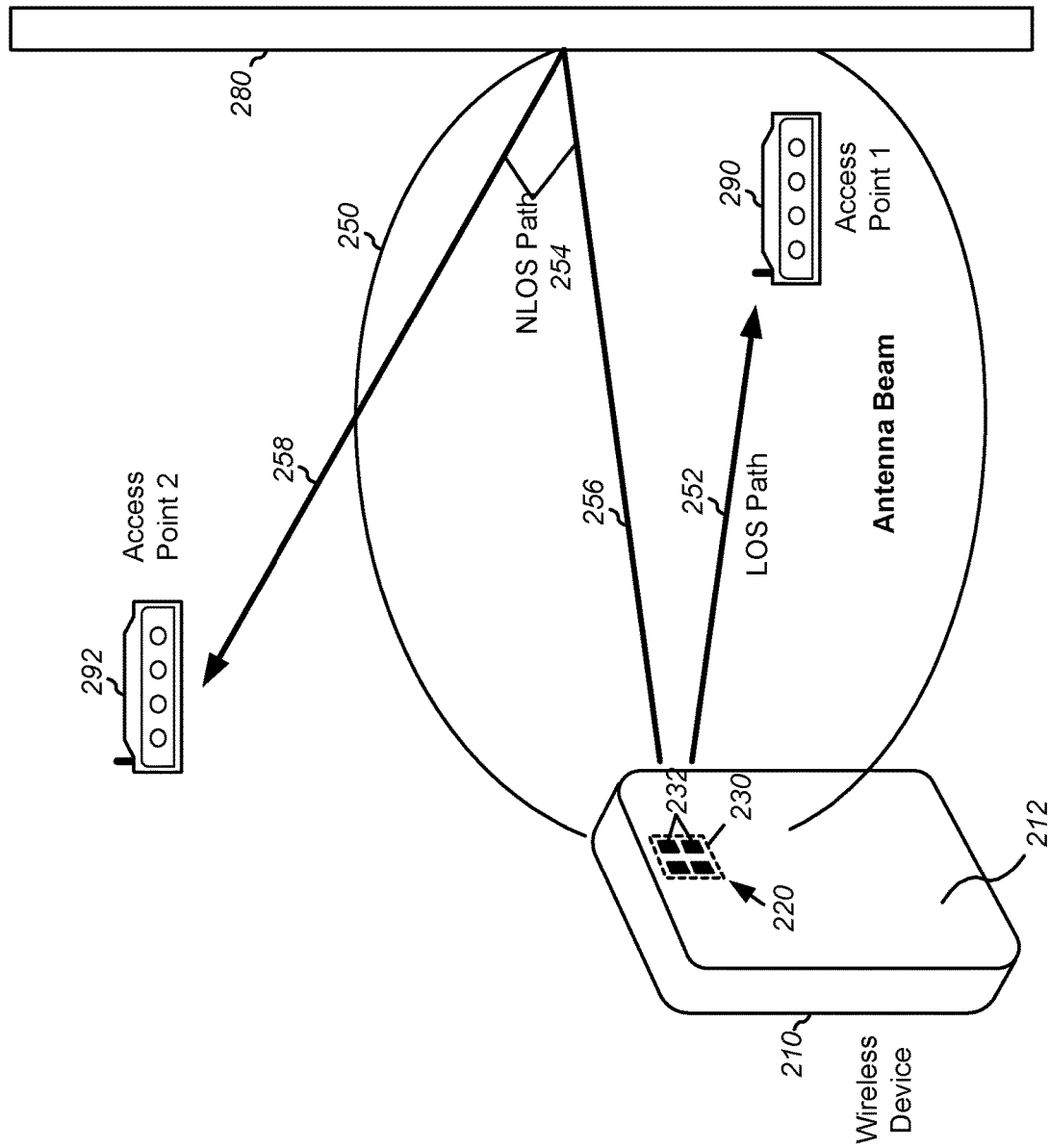
FIG. 2 shows a wireless device with a 2-dimensional (2-D) antenna system.

Referring to FIG. 2, an exemplary design of a wireless device 210 with a 2-D antenna system 220 is shown. In this exemplary design, antenna system 220 includes a 2×2 array 230 of four patch antennas 232 (i.e., radiators) formed on a single geometric plane corresponding to a back surface of wireless device 210 (e.g., a backside array). While the antenna system 220 is visible in FIG. 2, in operation the patch array may be disposed on a PC board, antenna carrier, or other assembly located on an inside surface of a device cover 212. The patch antenna array 230 has an antenna beam 250, which may be formed to point in a direction that is orthogonal to the plane on which patch antennas 232 are formed or in a direction that is within a certain angle of orthogonal, for example up to 60 degrees in any direction from orthogonal. Wireless device 210 can transmit signals directly to other devices (e.g., access points) located within antenna beam 250 and can also receive signals directly from other devices located within antenna beam 250. Antenna beam 250 thus represents a line-of-sight (LOS) coverage of wireless device 210.

An antenna element may be formed on a plane corresponding to a surface of a wireless device and may be used to transmit and/or receive signals. The antenna element may have a particular antenna beam pattern and a particular maximum antenna gain, which may be dependent on the design and implementation of the antenna element. Multiple antenna elements may be formed on the same plane and used to improve antenna gain. Higher antenna gain may be especially desirable at MMW frequency since (i) it is difficult to efficiently generate high power at MMW frequency and (ii) attenuation loss may be greater at MMW frequency.

For example, an access point 290 (i.e., another device) may be located inside the LOS coverage of wireless device 210. Wireless device 210 can transmit a signal to access point 290 via a line-of-sight (LOS) path 252. Another access point 292 may be located outside the LOS coverage of wireless device 210. Wireless device 210 can transmit a signal to access point 292 via a non-line-of-sight (NLOS) path 254, which includes a direct path 256 from wireless device 210 to a wall 280 and a reflected path 258 from wall 280 to access point 292.

In general, the wireless device 210 may transmit a signal via a LOS path directly to another device located within antenna beam 250, e.g., as shown in FIG. 2. Ideally, this signal may have a much lower power loss when received via the LOS path. The low power loss may allow wireless device 210 to transmit the signal at a lower power level, which may enable wireless device 210 to conserve battery power and extend battery life.

The wireless device 210 may transmit a signal via a NLOS path to another device located outside of antenna beam 250, e.g., as also shown in FIG. 2. This signal may have a much higher power loss when received via the NLOS path, since a large portion of the signal energy may be reflected, absorbed, and/or scattered by one or more objects in the NLOS path. Wireless device 210 may transmit the signal at a high power level in an effort to ensure that the signal can be reliably received via the NLOS path.

Figure 3:
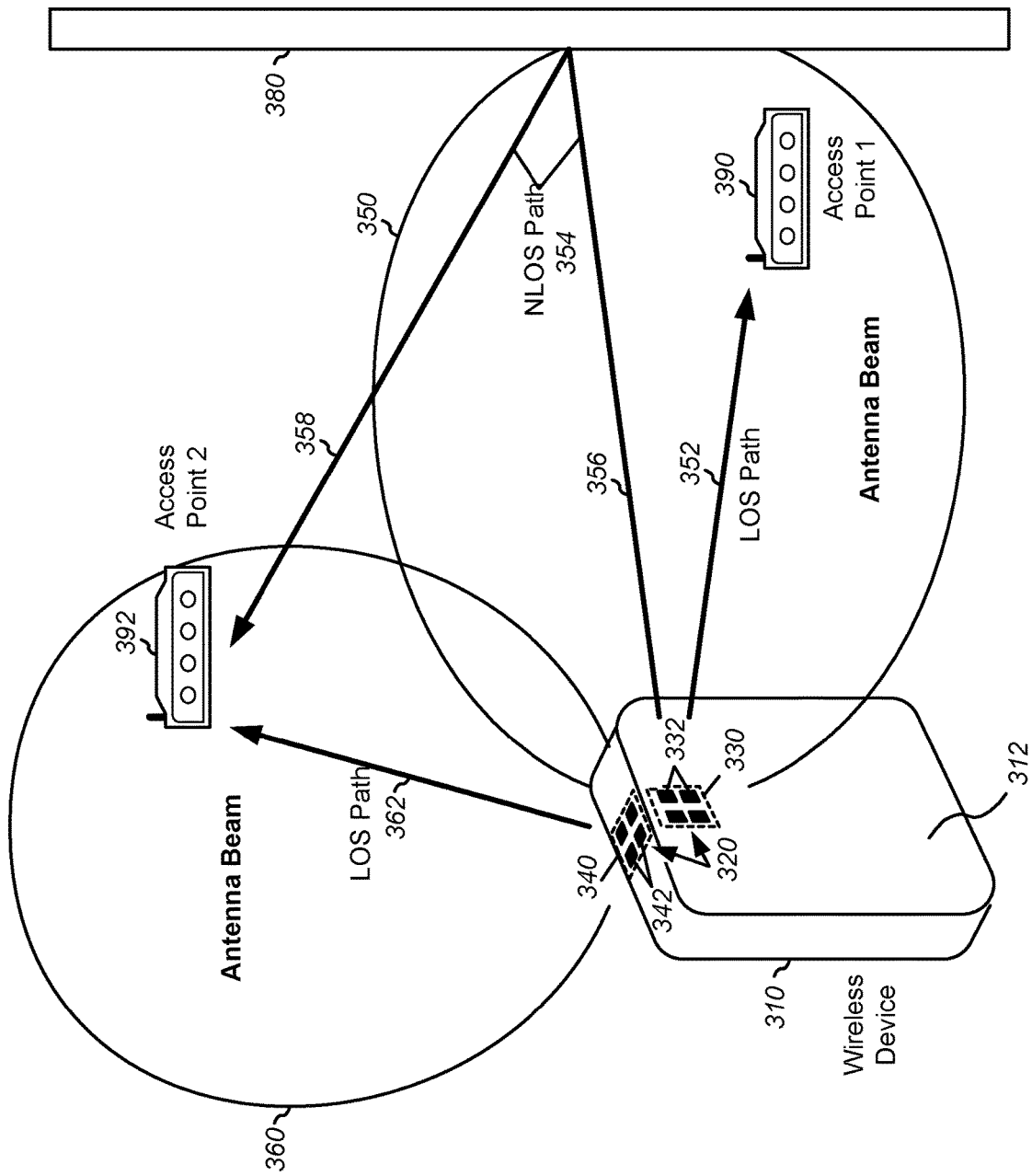
FIG. 3 shows a wireless device with a 3-dimensional (3-D) antenna system.

Referring to FIG. 3, an exemplary design of a wireless device 310 with a 3-D antenna system 320 is shown. In this exemplary design, antenna system 320 includes (i) a 2×2 array 330 of four patch antennas 332 formed on a first plane corresponding to the back surface of wireless device 310 and (ii) a 2×2 array 340 of four patch antennas 342 formed on a second plane corresponding to the top surface of wireless device 310 (e.g., an end-fire array). The patch antenna arrays 330, 340 are disposed on the inside of a device cover 312. The antenna array 330 has an antenna beam 350, which points in a direction that is orthogonal to the first plane on which patch antennas 332 are formed. Antenna array 340 has an antenna beam 360, which points in a direction that is orthogonal to the second plane on which patch antennas 342 are formed. In an example, the array 330 may point in a direction that is within a certain angle of orthogonal, for example up to 60 degrees in any direction from orthogonal. Antenna beams 350 and 360 thus represent the LOS coverage of wireless device 310. While the arrays 330 and 340 are each illustrated as a 2×2 array in FIG. 3, one or both may include a greater or fewer number of antennas, and/or the antennas may be disposed in a different configuration. For example, one or both of the arrays 330 and 340 may be configured as a 1×4 array.

An access point 390 (i.e., another device) may be located inside the LOS coverage of antenna beam 350 but outside the LOS coverage of antenna beam 360. Wireless device 310 can transmit a first signal to access point 390 via a LOS path 352 within antenna beam 350. Another access point 392 may be located inside the LOS coverage of antenna beam 360 but outside the LOS coverage of antenna beam 350. Wireless device 310 can transmit a second signal to access point 392 via a LOS path 362 within antenna beam 360. Wireless device 310 can transmit a signal to access point 392 via a NLOS path 354 composed of a direct path 356 and a reflected path 358 due to a wall 380. Access point 392 may receive the signal via LOS path 362 at a higher power level than the signal via NLOS path 354.

The wireless device 310 shows an exemplary design of a 3-D antenna system comprising two 2×2 antenna arrays 330 and 340 formed on two planes (e.g., backside and end-fire arrays). In general, a 3-D antenna system may include any number of antenna elements formed on any number of planes pointing in different spatial directions. The planes may or may not be orthogonal to one another. Any number of antennas may be formed on each plane and may be arranged in any formation. The antenna arrays 330, 340 may be formed in an antenna carrier substrate and/or within the device cover 312. The device cover 312 may be a single component, or assembly comprising multiple components, configured to enclose and protect the antenna elements and device electronics from environmental and operational factors (e.g., impact damage, water resistance, skin oils, etc. . . . ).

Figure 4:
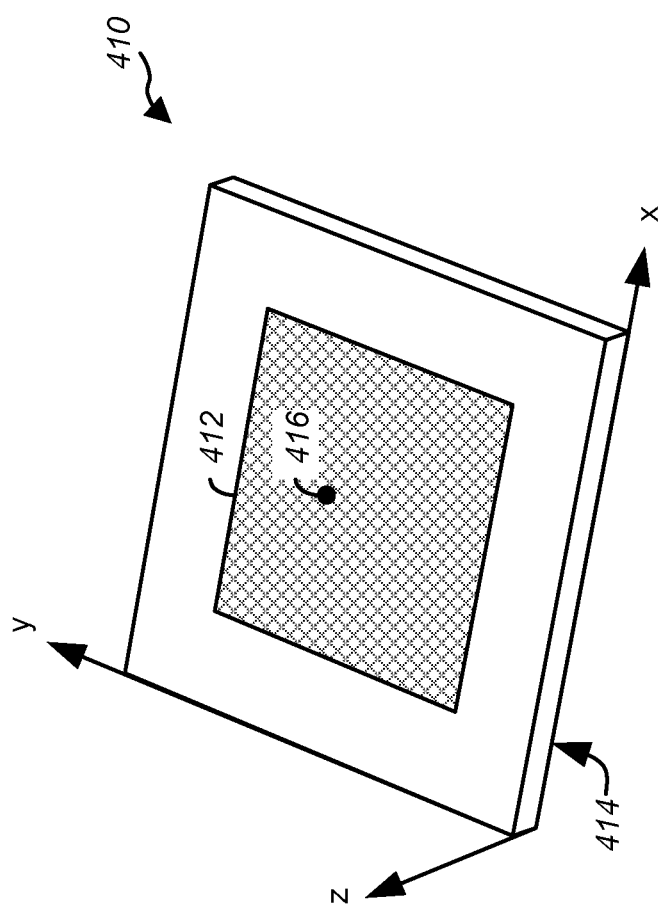
FIG. 4 shows an exemplary design of a patch antenna.

Referring to FIG. 4, an exemplary design of a patch antenna 410 suitable for MMW frequencies is shown. The patch antenna 410 includes a radiator such as a conductive patch 412 formed over a ground plane 414. In an example, the patch 412 has a dimension (e.g., 1.55×1.55 mm) selected based on the desired operating frequency. The ground plane 414 has a dimension (e.g., 2.5×2.5 mm) selected to provide the desired directivity of patch antenna 410. A larger ground plane may result in smaller backlobes. In an example, a feedpoint 416 is located near the center of patch 412 and is the point at which an output RF signal is applied to patch antenna 410 for transmission. Multiple feed points may also be used to vary the polarization of the patch antenna 410. For example, at least two conductors may be used for dual polarization (e.g., a first conductor and a second conductor may be used for a horizontal-pol feed line and a vertical-pol feed line). The locations and number of the feedpoints may be selected to provide the desired impedance match to a feedline. Additional patches may be assembled in an array (e.g., 1×2, 1×3, 1×4, 2×2, 2×3, 2×4, 3×3, 3×4, etc. . . . ) to further provide a desired directivity and sensitivity. The ground plane 414 may be disposed under all of the patches in the array.

Figure 5A:
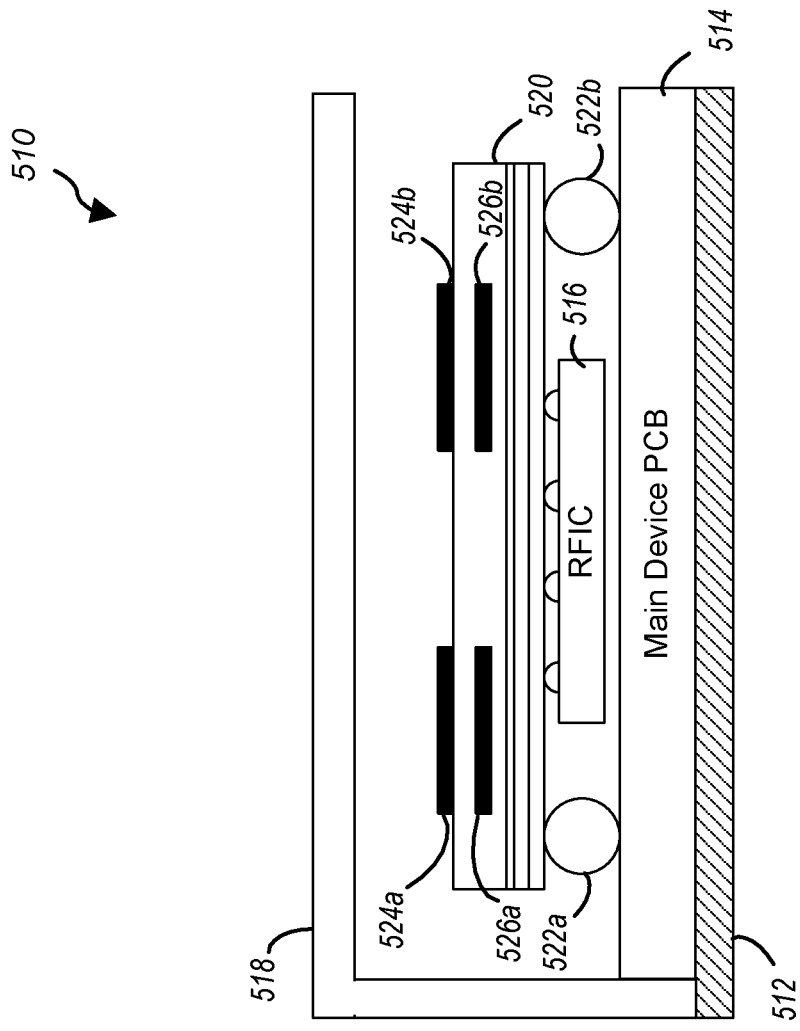
FIGS. 5A and 5B illustrate physical constraints to the form factor of a wireless device caused by high-frequency radio modules.
Figure 5B:
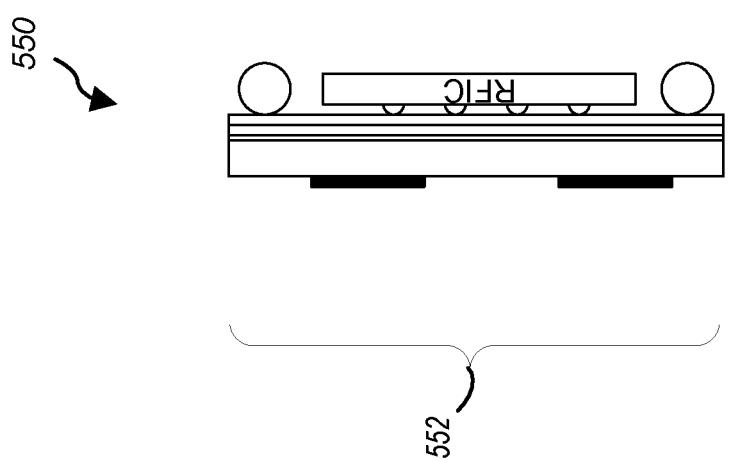

Referring to FIGS. 5A and 5B, an example of physical constraints to the form factor of a wireless device 510 caused by high-frequency radio modules is shown. The wireless device 510 includes a display device 512, a device cover 518, and a main device printed circuit board (PCB) 514. The main device PCB 514 may be at least one printed circuit board or a plurality of printed circuit boards. A MMW module PCB 520 is operably coupled to the main device PCB 514 via at least one conductor 522a-b in one or more ball grid arrays (BGA). The BGA may be configured to enable one or more signals to flow between the MMW module PCB 520 and the main device PCB 514. The MMW module PCB 520 may include a plurality of patch antennas 524a-d and corresponding passive patches 526 to form a wideband antenna. The MMW module PCB 520 also includes signal and ground layers which further increase the thickness of the PCB 520. At least one radio frequency integrated circuit (RFIC) 516 is mounted to the MMW module PCB 520 and operates to adjust the power and the radiation beam patterns associated with the patch antenna array 524a-d. The RFIC 516 is an example of an antenna controller and may be configured to utilize phase shifters and hybrid antenna couplers to control the power directed to the antenna array and to control the resulting beam pattern. The MMW module PCB 520 is configured in a backside configuration to generate a beam on the back side (i.e., opposite the display 512) of the wireless device 510.

Referring to FIG. 5B, an example end-fire MMW module PCB 550 is shown. The complexity of the RF circuits may require that the end-fire MMW module PCB 550 be at least a minimum width 552. The dimensions of an PCB 550 may impact the minimum width 552. As a result, the inclusion of the end-fire MMW module PCB 550 may impact the overall form factor the wireless device 510. As depicted in FIGS. 5A and 5B, the minimum width 552 of the end-fire MMW module PCB 550 may be larger than the width of the wireless device 510. As a result, the dimensions of the wireless device 510 may need to be increased to accommodate the end-fire MMW Module PCB 550. Further, a thickness of the module PCB 550 may require a certain clearance between the main device PCB 514 and the cover 518, which may also result in a need to increase the dimension of the wireless device 510.

The flex integrated antenna array as described herein provides an alternative design which may be used to decrease the form factor of a wireless device.

Figure 6:
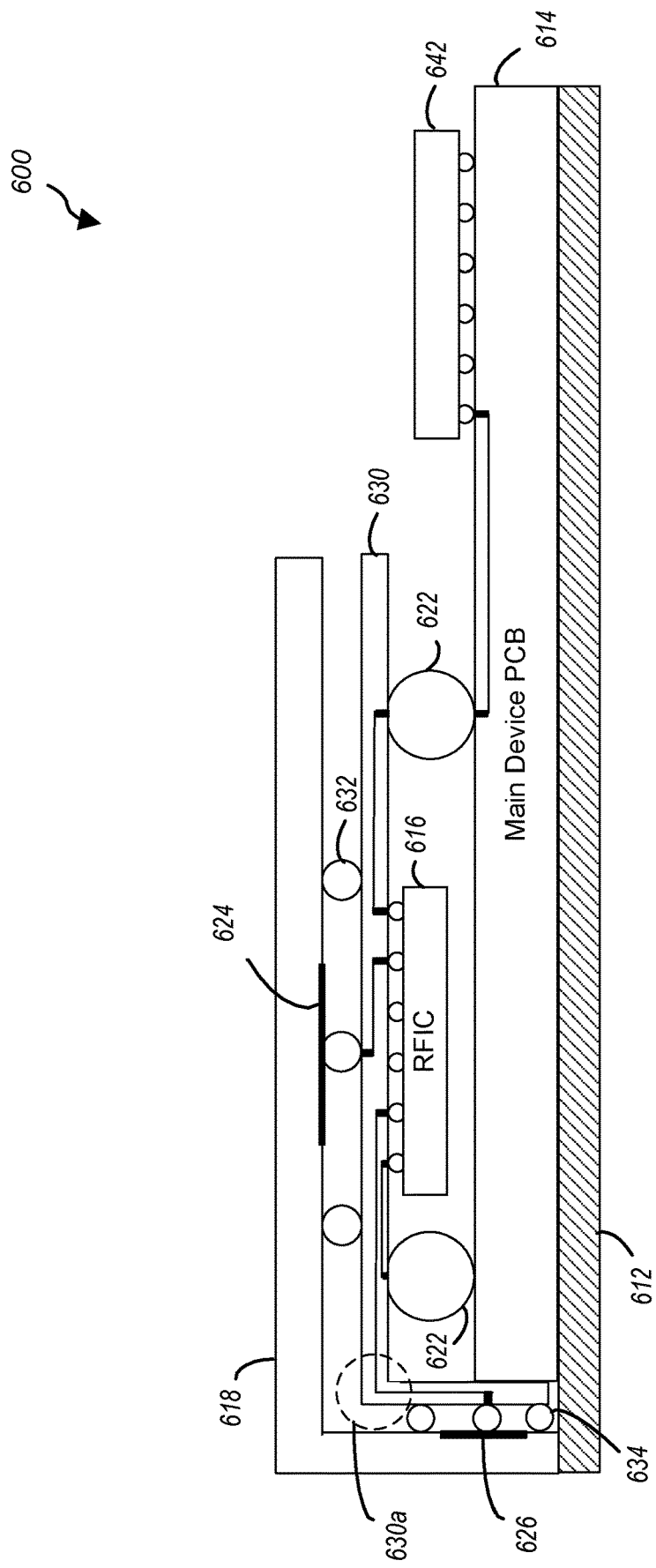
FIG. 6 shows an example of an antenna array with a flex cable.

Referring to FIG. 6, an example of a wireless device 600 with an antenna array and a flex cable 630 is shown. The device 600 includes a display device 612 and an antenna carrier 618 configured to be used in a wideband antenna design. The device 600 includes a main device PCB 614 operably coupled to the flex cable 630 via one or more connectors 622 such as a ball grid array. The terms flex cable and flex cable assembly may be used interchangeably. The flex cable 630 includes a plurality of conductors and is configured to be operably coupled to an integrated circuit (RFIC) 616 and one or more radiators (the RFIC 616 or any of the other RFICs illustrated in the other figures may include or be coupled to one or more support structures (not shown in FIG. 6) configured to physically secure the RFIC, for example to the PCB 614). The one or more connectors 622 may enable one or more signals to flow from the main device PCB 614 to the RFIC 616 via the flex cable 630. Similarly, connectors between the flex cable 630 and the RFIC 616 may physically attach these two elements and/or enable one or more signals to flow from the RFIC 616 to the flex cable 630 or vice versa. In an embodiment, such connectors comprise a ball grid array or other connection means and/or conduction means. The flex cable 630 may be coupled to a backside radiator 624 via one or more contacts in a first ball grid array 632. The flex cable 630 may also be coupled to an end-fire radiator 626 via one or more contacts in a second ball grid array 634. While FIG. 6 depicts only two radiators 624, 626, the flex cable 630 may be configured to operably couple the RFIC 616 to multiple radiators in the wireless device 600. The RFIC 616 is an example of an antenna controller and may be configured to utilize phase shifters and hybrid antenna couplers to control the power directed to the antenna array and to control the resulting beam pattern radiating from one or more antenna arrays. In some embodiments, a cutout, cavity or recess (not illustrated) is formed in the main device PCB 614 and the RFIC 616 is partially or fully disposed therein. In some such embodiments, the connectors 622 may be reduced in size or omitted. For example, in some embodiments the flex cable 630 is affixed to the main device PCB 614 with an adhesive in the absence of the connectors 622. Such embodiments may result in a reduced thickness of the device 600.

In an example, the antenna carrier 618 may be a device cover configured to provide an exterior surface to the device 600. The antenna carrier 618 may also be disposed within a device cover. In general, the antenna carrier 618 may be composed of a plastic, glass, or other non-conductive material and may include a plurality of metal radiators disposed in one or more arrays on the antenna carrier 618. The radiators 624, 626 may be printed or affixed to the antenna carrier 618 via a laser deposition technology (LDT), a physical vapor deposition (PVD), or other printing and/or deposition technologies. In an example, the radiators 624, 626 may be affixed to the antenna carrier 618 with a thermal process, or with an adhesive material. In some embodiments, one or more plates or patches are formed within the carrier 618 and configured to parasitically couple to the radiator 624 or 626. Each of radiators 624, 626 may be an array of radiators. For example, the radiator 624 may be first array of radiators and the radiator 626 may be a second array of radiators. The antenna carrier 618 may be comprised of more than one assembly. For example, a first set of radiators may be disposed on a first antenna carrier and a second set of radiators may be disposed on a second antenna carrier.

In operation, the flex cable 630 includes leads and contacts based on the pattern of the RFIC 616. The flex cable may be configured to conduct RF signals to radiators as well as other signals such as power, ground, Intermediate Frequency (IF) signals, and other digital control signals. In an example, the main PCB 614 or one or more other components coupled thereto may be configured to generate an IF signal (e.g., in the range of 6-11 GHz) and the RFIC 616 may receive the IF signal via the one or more connectors 622 and the flex cable 630. The RFIC 616 may be configured to convert signals between the intermediate frequency and the millimeter-wave frequencies (e.g., 28/39/60 GHz). For example, a circuit separate from the RFIC 616, but connected to the RFIC via the flex cable 630, may be configured to convert a signal between the IF and a baseband frequency. The RFIC 616 may be configured to receive the IF via the flex cable 630 and convert the signal to a millimeter-wave frequency. In the embodiment illustrated in FIG. 6, a transceiver 642 is configured to convert a signal between the IF and a baseband frequency, and to transmit IF signals to and receive IF signals from the RFIC 616. While the transceiver 642 is illustrated as being coupled to the RFIC 616 through the main PCB 614 and the connector 622, other means for coupling the transceiver 642 to the RFIC 616 (for example, a coaxial cable) may alternatively or additionally be used. The transceiver 642 or other separate circuit may be remote from the RFIC 616, and may include or be operably coupled to a processor or other processing means, for example that may be configured to modulate information (e.g., a modem).

The antenna carrier 618 may be a separate PCB board, or it may be integrated with a device housing, and the flex cable 630 is the carrier of RFIC routing lines. The flex cable 630 may be disposed to conform to space limited applications with tight radius bends 630a. (e.g., bends of 45°, 60°, 90°, 120°, 180°—such as when antenna assemblies are implemented on either side of the PCB 614—etc.) As a result, the flex cable 630 enables the placement of MMW antenna arrays at the thin edges of the wireless device 600. A ball grid array interface is an example method to simultaneously support antenna alignment as well as the probe feeding to the patch antennas, which may for example be designed at 28/39 GHz bands (or higher, for example in bands in the 60s of GHz or higher, or for use with other millimeter-wave frequencies) for 5G and/or WLAN applications. In an example, the flex cable 630 may be Murata METROCIRC cable including a multilayer resin substrate configured for high-frequency applications. In an example, Panasonic's low transmission loss flexible multi-layer circuit boards, comprising a liquid-crystal polymer (LCP) and bonding sheet material, may be used as the flex cable 630. Other materials may also be used.

The overall thickness of the wireless device 600 may be reduced as compared to the example in FIGS. 5A and 5B because the flex cable 630 is a carrier for the RFIC routings and thus eliminates the need for a second MMW module (e.g., the end-fire MMW module PCB 550). Further, in some embodiments, the thickness of the device 600 may be reduced, for example when radiators are integrated in a cover instead of in a separate PCB.

The radiators 624, 626 may include multiple radiators such as a patch antenna array including a matrix of radiators. For example, the radiators 624, 626 may include array dimensions such as 1×2, 1×3, 1×4, 2×2, 2×3, 2×4, 3×3, 3×4, etc. While not specifically illustrated, one or more of the radiators may be configured to radiate in two orthogonal polarizations, as described in more detail below with respect to FIGS. 7A and 7B. The antenna carrier 618 may be used in 2-D antenna systems, such as the array 230 depicted in FIG. 2. 3-D solutions may also be realized such that radiators may be disposed on two or more sides of the antenna carrier 618 which may correspond with the patch antenna arrays 330, 340 in FIG. 3. More than one antenna carrier assembly (i.e., multiple parts) may be used to support the radiators. In an example, a device cover may be used as the antenna carrier. Other structures may also be used to secure radiator arrays on one or more geometric planes. For example, the first set of radiators 624 may be disposed on a first geometric plane and the second set of radiators 626 may be disposed on a second geometric plane. The geometric planes of radiators 624, 626 may be different from a third plane including the RFIC 616.

Referring to FIGS. 7A and 7B, an example of a patch antenna array with flex cable 730 is shown. The patch antenna array includes an antenna carrier 718, a plurality of radiators 724*a-d*, a ball grid array 732, and a plurality of feeding probes 733*a-h*. The radiators 724*a-d* are not limited to square patch antennas as depicted in FIGS. 7A and 7B. Other patch geometries and radiator types (e.g., strip-type antenna arrays) may be used. For example, the plurality of radiators 724*a-d* may be metallic patch, strip-shape, dipole and other radiator configurations. The radiators 724*a-d* may be arranged in a 1×4 array as depicted in FIG. 7B. Other array dimensions such as 1×2, 1×3, 2×2, 2×3, 2×4, 3×3, 3×4, etc. . . . may be used. In an embodiment, stacked arrays may be used to increase the bandwidth of an antenna array. The plurality of feeding probes 733*a-h* are configured to operably couple the flex cable 730 to the respective radiators 724*a-d*. The flex cable 730 may include a plurality of feed lines 740*a-h* configured to provide RF signals from an radio frequency integrated circuit (RFIC) (not shown in FIG. 7A) to the radiators 724*a-d*. For example, each radiator 724*a-d* may receive signals via horizontal-pol feed lines 740*a*, 740*c*, 740*e*, 740*g* and vertical-pol feed lines 740*b*, 740*d*, 740*f*, 740*h*. The radiators 724*a-d* may be printed on the backside of antenna carrier 718. In an example, the antenna carrier 718 may be a device cover. The antenna carrier 718 may be composed of a plastic, glass, or other non-conductive material and may include a plurality of metal radiators disposed in one or more arrays on the antenna carrier 718. The radiators 724*a-d* may be printed or affixed to the antenna carrier 718 via a laser deposition technology (LDT), a physical vapor deposition (PVD), or other printing and/or deposition technologies. In an example, the radiators 724*a-d* may be affixed to the antenna carrier 718 with a thermal process, or with an adhesive material. For MMW operations, the dimensions of each of the radiators 724*a-d* may have length and width dimensions in the range of 0.5 mm to 3.0 mm. Other dimensions may be used with different radiator configurations.

The ball grid array 732 includes a plurality of solder balls configured to provide attachment and mechanical support between the flex cable 730 and the antenna carrier 718. In an example, the solder balls may be approximately 0.2 mm-1.0 mm (pre-collapse dimensions). Other ball grid array technologies such as metal coated glass balls, plastic, ceramic, glass, Teflon®, copper pillars, or other materials may be used to provide structural support. The feeding probes 733*a-h* may be a conductor in a ball grid array configured to electrically couple a feed line in the flex cable 730 with a radiator 724*a-d*.

Figure 8:
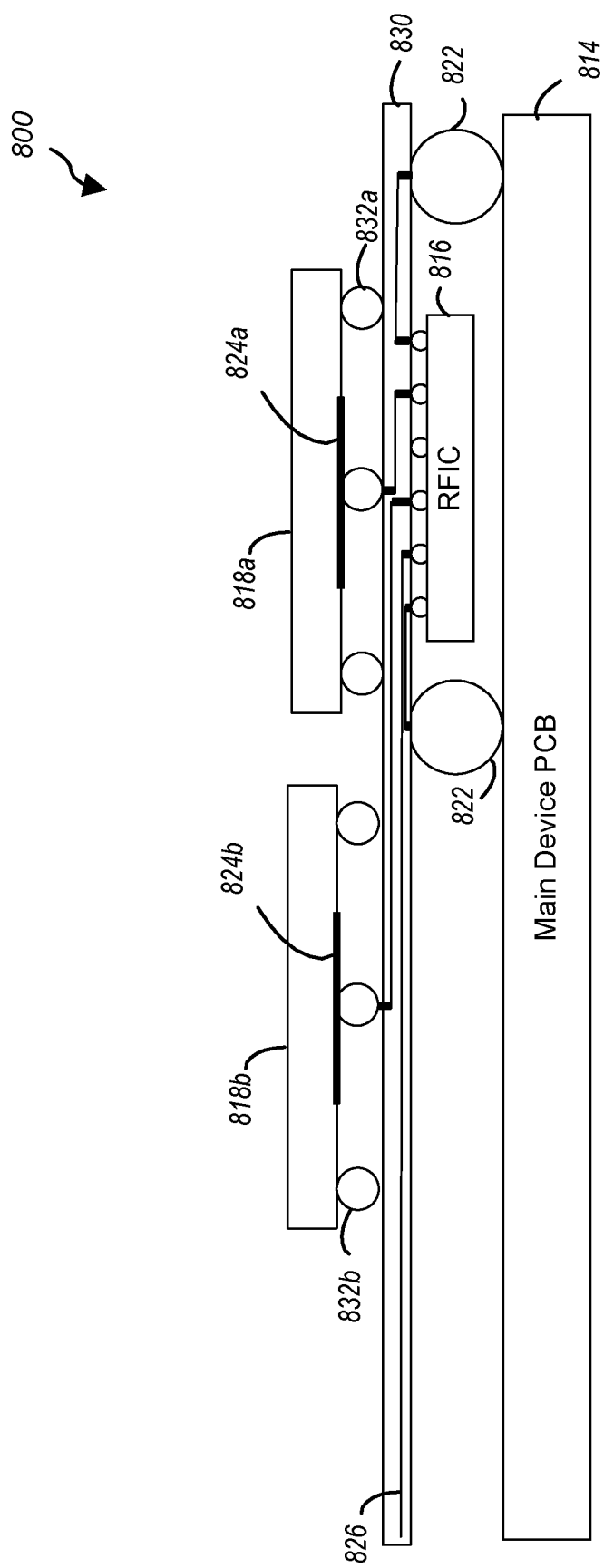
FIG. 8 shows an example of a multi-array antenna with a flex cable.

Referring to FIG. 8, an example of a wireless device 800 with a multi-array antenna and a flex cable 830 is shown. The device 800 includes a plurality of antenna carriers 818*a-b* configured to be used in a wideband antenna design. The device 800 may include a main device PCB 814 operably coupled to the flex cable 830 via one or more connectors 822 such as a ball grid array. The one or more connectors 822 may enable one or more signals to flow from the main device PCB 814 to the RFIC 816 via the flex cable 830. The flex cable 830 includes a plurality of conductors and is configured to be operably coupled to an integrated circuit (RFIC) 816 and one or more radiators 824*a-b* in the antenna carriers 818*a-b*. The flex cable 830 may be coupled to the antenna carriers 818*a-b* and the radiators 824*a-b* via one or more ball grid arrays 832*a-b*. The flex cable 830 may also include one or more dipole and/or strip-shaped antennas 826 which are configured to be radiators (e.g., and not coupled to another conductor such as a patch). While FIG. 8 depicts only two antenna carriers 818*a-b*, multiple antenna carriers with multiple radiators may be coupled to the RFIC 816 via the flex cable 830. In some embodiments, one or more antenna carriers are disposed between the flex cable 830 and the main device PCB 814. In such embodiments, space between the flex cable 830 and the main device PCB 814 created by the connectors 822 may be utilized to locate an antenna carrier, similar to how the RFIC 816 is located. For example, either the antenna carrier 818*a* (when offset from the RFIC 816) or the antenna carrier 818*b*, or both, may be disposed on the opposite side of the flex cable 830 than is illustrated in FIG. 8. In some such embodiments, a thickness of the device 800 may be further reduced, and/or it may be possible to fabricate the device 800 without disposing antennas on the cover thereof.

Figure 9:
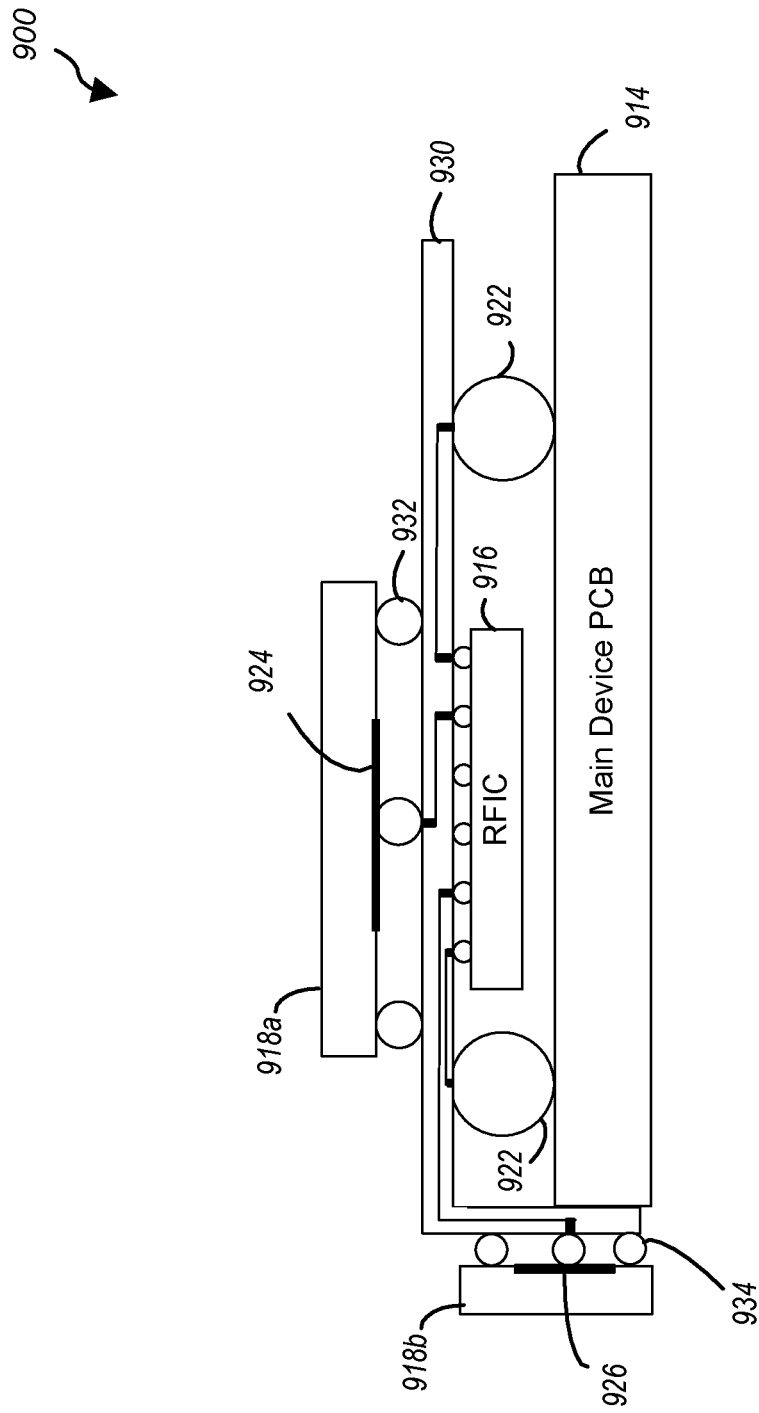
FIG. 9 shows an example dual-pol array with a plurality of antenna carriers and a flex cable.

Referring to FIG. 9, an example of a wireless device 900 with an antenna array with a plurality of antenna carriers and a flex cable 930 is shown. The device 900 includes a plurality of antenna carriers 918*a-b* configured to be used in a wideband antenna design. The device 900 includes a main device PCB 914 operably coupled to the flex cable 930 via one or more connectors 922 such as a ball grid array. The one or more connectors 922 may enable one or more signals to flow from the main device PCB 914 to the RFIC 916 via the flex cable 930. The flex cable 930 may be Murata METRO-CIRC cable including a multilayer resin substrate configured for high-frequency applications. The pattern of the flex cable 930 may be based on the pattern of an antenna control circuit such as an integrated circuit (RFIC) 916. The flex cable 930 may be coupled to a backside antenna carrier 918a and a backside radiator 924 via one or more contacts in a first ball grid array 932. The backside antenna carrier 918a may be configured as an array, such as the 2×2 array 230 in FIG. 2, or a 1×4 array. The flex cable 930 may also be coupled to an end-fired antenna carrier 918b and an end-fired radiator 926 via one or more contacts in a second ball grid array 934. The end-fired antenna carrier 918b may be configured as an array, such as the 2×2 array 340 in FIG. 3, or a 1×4 array. The antenna carriers 918a-b may each be configured with an array of radiators (e.g., comprising arrays of 1×2, 1×3, 1×4, 2×2, 2×3, 2×4, 3×3, 3×4, etc. . . . radiators). The flex cable 930 may be configured to operably couple the RFIC 916 to each of the radiators in a wireless device. In an embodiment, multiple RFICs may be electrically coupled to the flex cable 930. In an example, the antenna carriers 918a-b may be a device cover configured to provide an exterior surface to the device 900. The antenna carriers 918a-b may be composed of a plastic, glass, or other non-conductive material and may include a plurality of metal radiators disposed in one or more arrays. The flex cable 930 may be configured to conduct RF signals to radiators as well as other signals such as power, ground, Intermediate Frequency (IF) signals, and/or other digital control signals. In an example, the main PCB 914 may be configured to generate an intermediate frequency (IF) signal (e.g., in the range of 6-11 GHz) and the RFIC 916 may receive the IF signal via the one or more connectors 922 and the flex cable 930. The RFIC 916 or one or more other components (not illustrated) coupled thereto may be configured to convert signals between the intermediate frequency and the 5G transmission frequencies (e.g., 28/39/60 GHz). The first and second ball grid arrays 932, 934 are configured to simultaneously support antenna alignment of the antenna carriers 918a-b, and provide probe feeding to the radiators 924, 926. Various elements of the ball grid arrays 932, 934 may be configured differently. For example, the elements which support the antenna carriers 918a-b may have a first configuration or be formed from a first material, and the elements which feed the radiators 924, 926 may have a second configuration or be formed from a second material.

In some embodiments, however, all of the elements of the ball grid arrays 932, 934 are similarly configured. In an embodiment, stacked antenna carriers and radiators may be included in the wireless device. Stacking the radiators may increase the bandwidth of the antenna array. Further, in some embodiments the flex cable 930, ball grid arrays 932 and/or 934, and the radiators 924 and/or 936 may be configured such that energy may be radiated with a dual polarization, for example as described above with respect to FIGS. 7A and 7B. In such embodiments, the antenna arrays may be configured as dual pol arrays. In some embodiments, one or both of the antenna carriers 918a-b may be disposed between the flex cable 930 and the main device PCB 914.

Figure 10:
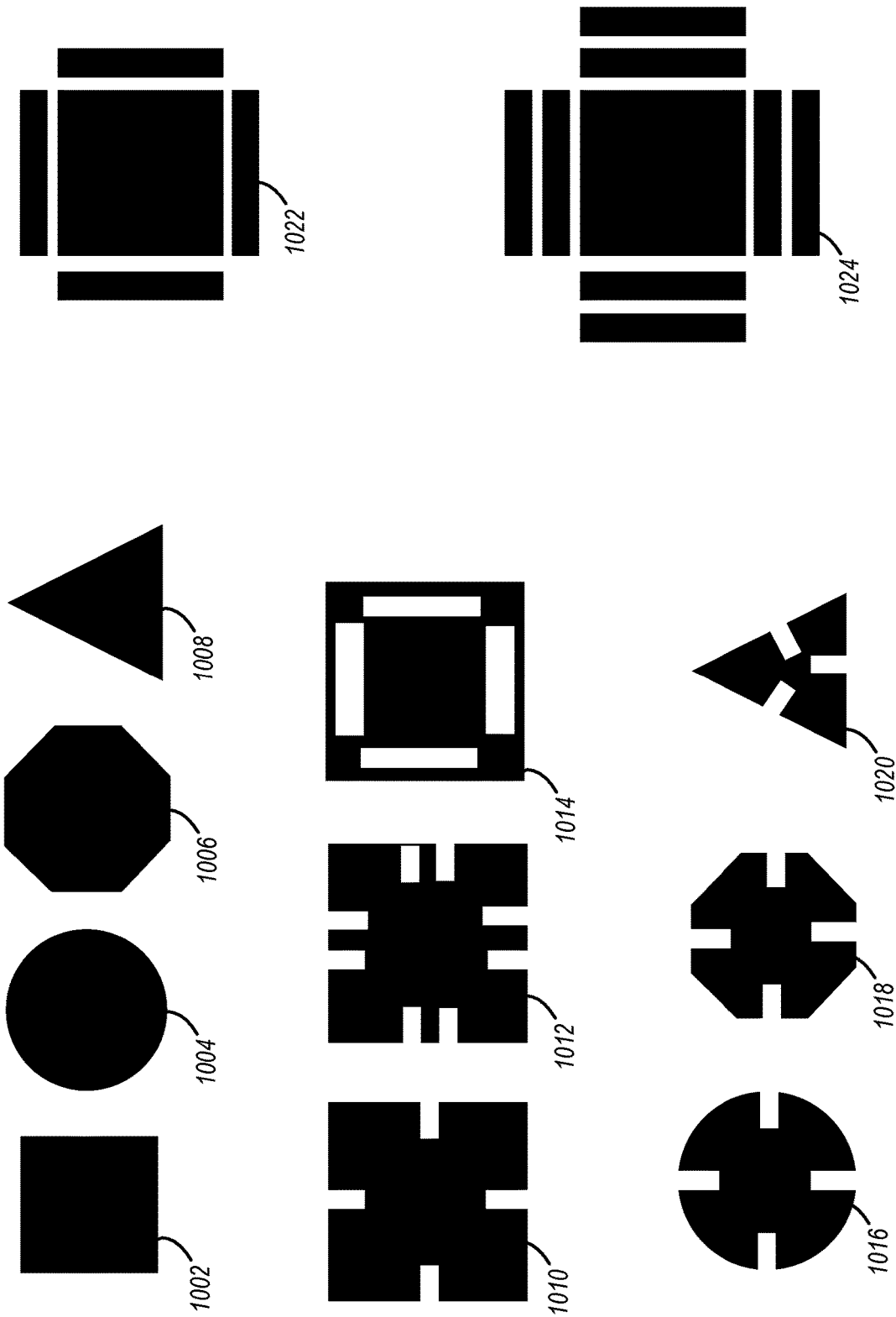
FIG. 10 provides examples of patch antenna geometries.

Referring to FIG. 10, with further references to FIGS. 6-9, examples of patch antenna geometries are shown. In general, the size and shape of a radiator may be varied based on frequency, bandwidth and beam forming requirements. The radiators 624, 626, 724a-d, 824a-b, 924 and 926 in FIGS. 6-9 are depicted as square patches such as the square patch 1002 in FIG. 10. This square geometry is an example only and not a limitation as other radiator shapes and configurations may be used. For example, a patch antenna array may be comprised of one or more patches including other shapes such as a circle patch 1004, an octagon patch 1006, and a triangle patch 1008. Other shapes may also be used and an array may include patches with differing shapes. The properties of a patch antenna may be varied by changing the boundaries of the individual patches. For example, a square patch with single notches 1010, a square patch with multiple notches 1012, and a square patch with parallel notches 1014 may be used as a radiator. The square patch geometry is an example only and not a limitation as other shapes may include one or more notches such as a circle with notches 1016, an octagon with notches 1018, and a triangle with notches 1020. The shape and locations of the notches may vary. For example, the notches may be semicircles, triangles, or other shaped areas of material that are removed from the patch. A patch antenna may include one or more parasitic radiators disposed in proximity to the patch. For example, a patch with one set of parasitic radiators 1022 and a patch with two sets of parasitic radiators 1024 may be used. The geometry, number, and locations of the parasitic radiators may vary based on antenna performance requirements.

Figure 11A:
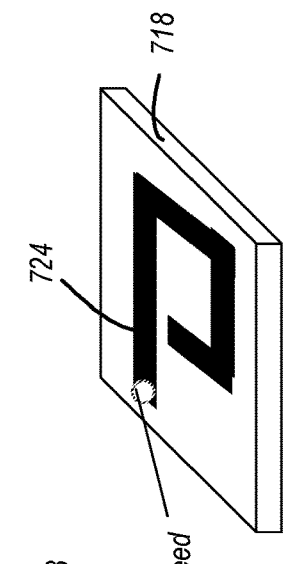
FIGS. 11A-11E provide examples of strip-shaped radiators.
Figure 11B:
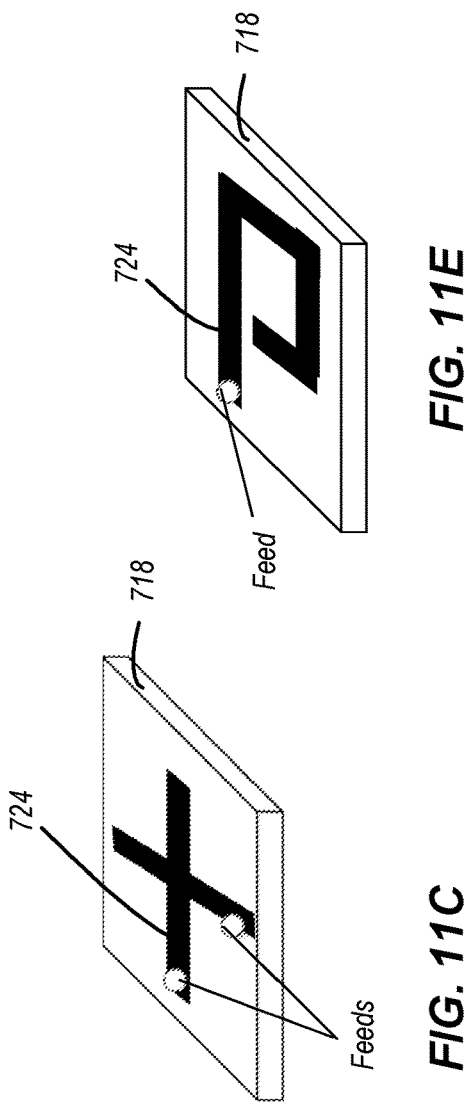
Figure 11C:
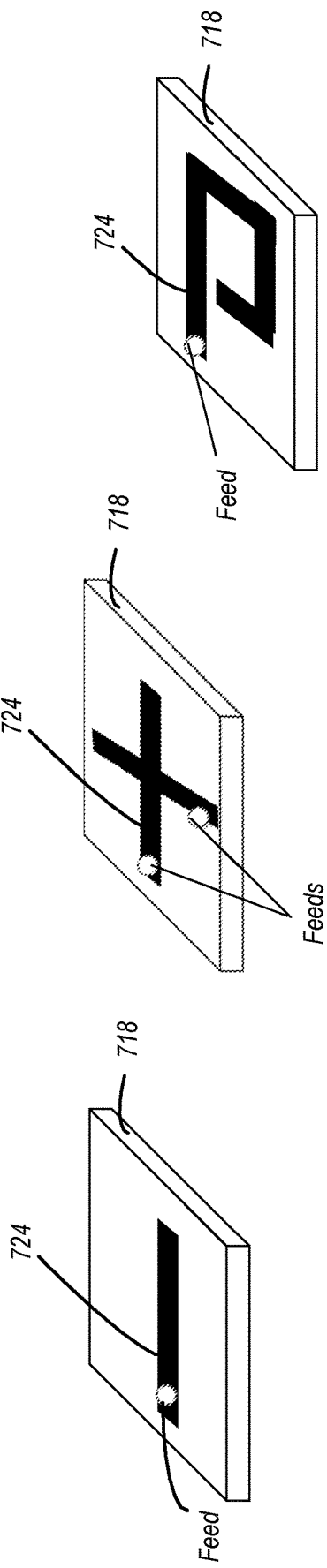
Figure 11D:
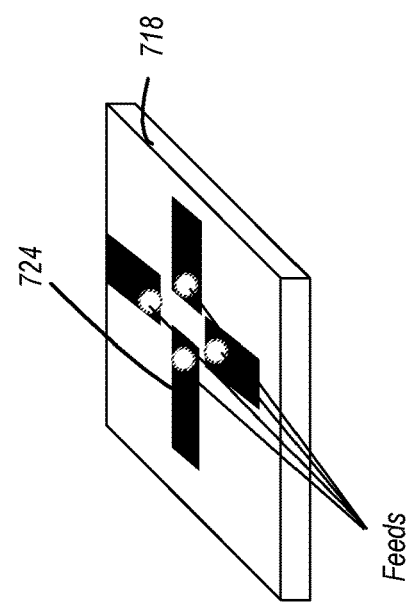
Figure 11E:
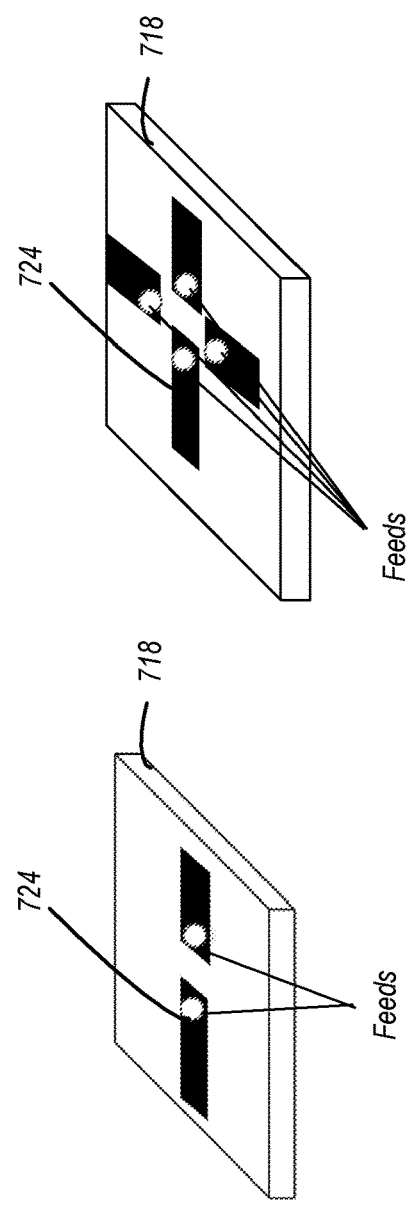

Referring to FIGS. 11A through 11E, and with further reference to FIGS. 6-9, examples of strip-shaped radiators are shown. The radiators described herein are not limited to antenna patches as depicted in FIGS. 6-9. The radiators may include one or more strip-shaped antennas with various orientations and feed points. For example, an antenna carrier 618, 718, 818a-b, 918a-b may include one or more strip-shaped radiators. In FIG. 11A, a radiator 724 may include a single-ended strip with feed point that is electrically coupled to the flex cable 730. In FIG. 11B, the radiator 724 may be configured to receive a differential feed from the flex cable 730. FIG. 11C, the radiator 724 may include single-ended strips with dual feeds electrically coupled to the flex cable 730. In FIG. 11D, the radiator 724 may be configured to receive dual differential feeds from the flex cable 730. The strip-shapes may be configured to form geometric shapes such as circles, spirals, s-shaped, etc. Referring to FIG. 11E, the radiator 724 may include a single-ended strip and feed with a spiral shape (e.g., for circular polarization).

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations provides a description for implementing described techniques. Various changes may be made in the function and arrangement of elements without departing from the spirit or scope of the disclosure.

Also, as used herein, "or" as used in a list of items prefaced by "at least one of" or prefaced by "one or more of" indicates a disjunctive list such that, for example, a list of "at least one of A, B, or C," or a list of "one or more of A, B, or C," or "A, B, or C, or a combination thereof" means A or B or C or AB or AC or BC or ABC (i.e., A and B and C), or combinations with more than one feature (e.g., AA, AAB, ABBC, etc.).

As used herein, unless otherwise stated, a statement that a function or operation is "based on" an item or condition means that the function or operation is based on the stated item or condition and may be based on one or more items and/or conditions in addition to the stated item or condition.

Components, functional or otherwise, shown in the figures and/or discussed herein as being connected, coupled (e.g., communicatively coupled), or communicating with each other are operably coupled. That is, they may be directly or indirectly, wired and/or wirelessly, connected to enable signal transmission between them.

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of operations may be undertaken before, during, or after the above elements are considered. Accordingly, the above description does not bound the scope of the claims.

Further, more than one invention may be disclosed.

What is claimed is:

1. A wireless device, comprising:
   at least one radio frequency integrated circuit configured along a first geometric plane of the wireless device;
   a flex cable assembly operably coupled to the at least one radio frequency integrated circuit; and
   at least one radiator configured along a second geometric plane of the wireless device and physically coupled to the flex cable assembly via at least one conductor in a ball grid array, wherein the second geometric plane is angled with respect to the first geometric plane.

2. The wireless device of claim 1 wherein the at least one radiator is printed on a device cover and the ball grid array is configured to physically couple the device cover to the flex cable assembly.

3. The wireless device of claim 1 wherein the at least one radiator is physically coupled to the flex cable assembly via a first conductor configured as a vertical-polarized feed line, and a second conductor configured as a horizontal-polarized feed line.

4. The wireless device of claim 1 further comprising a plurality of radiators physically coupled to the flex cable assembly via a plurality of conductors in at least one ball grid array.

5. The wireless device of claim 4 wherein the plurality of radiators includes a first array of radiators configured along the first geometric plane, and a second array of radiators configured along the second geometric plane.

6. The wireless device of claim 5 wherein the first array of radiators is a backside array and the second array of radiators is an end-fire array.

7. The wireless device of claim 1 wherein the at least one radiator is a metallic patch.

8. The wireless device of claim 1 wherein the at least one radiator is a strip-shaped radiator.

9. The wireless device of claim 1 further comprising at least one printed circuit board, wherein the flex cable assembly is operably coupled to the at least one radio frequency integrated circuit and the at least one printed circuit board.

10. The wireless device of claim 9 wherein the at least one printed circuit board includes a recess and the at least one radio frequency integrated circuit is disposed within the recess.

11. The wireless device of claim 10 wherein the recess comprises a cutout in the at least one printed circuit board and the at least one radio frequency integrated circuit is disposed within the cutout.

12. An antenna system, comprising:
    at least one radio frequency integrated circuit disposed in a first plane of a wireless device;
    a flex cable assembly operably coupled to the at least one radio frequency integrated circuit; and
    a first set of antenna elements formed on a second plane of the wireless device, wherein each antenna element in the first set of antenna elements is physically coupled to the flex cable assembly via at least one conductor in a first ball grid array, the first plane and the second plane being oriented in different spatial directions.

13. The antenna system of claim 12 wherein the first set of antenna elements includes a 1×4 patch antenna array.

14. The antenna system of claim 12 wherein the first set of antenna elements includes a 2×2 patch antenna array.

15. The antenna system of claim 12 wherein each antenna element in the first set of antenna elements is physically coupled to the flex cable assembly with at least two conductors.

16. The antenna system of claim 15 wherein the at least two conductors include a vertical-polarized feed line and a horizontal-polarized feed line.

17. The antenna system of claim 12, further comprising a second circuit remote from the radio frequency integrated circuit and operably coupled thereto, wherein the radio frequency circuit is configured to convert a signal between a millimeter-wave frequency and an intermediate frequency, and wherein the second circuit is configured to convert a signal between the intermediate frequency and a baseband frequency.

18. The antenna system of claim 12 further comprising a second set of antenna elements formed on a third plane of the wireless device.

19. The antenna system of claim 18 wherein each antenna element in the second set of antenna elements is physically coupled to the flex cable assembly via at least one conductor in a second ball grid array.

20. The antenna system of claim 18 wherein the first set of antenna elements or the second set of antenna elements are disposed on an inside surface of a device cover.

21. An apparatus, comprising:
    means for generating radio signals;
    a first means for radiating radio signals;
    a second means for radiating radio signals, wherein the first means for radiating radio signals is configured along a first geometric plane, and the second means for radiating radio signals is configured along a second geometric plane which is angled with respect to the first geometric plane; and
    a flexible coupling means for operably coupling the means for generating radio signals, the first means for radiating the radio signals, and the second means for radiating the radio signals, wherein the second means for radiating radio signals is physically coupled to the flexible coupling means via one or more conductors in a ball grid array.

22. The apparatus of claim 21 wherein the first means for radiating radio signals is printed on a device cover and a ball grid array is configured to physically couple the device cover to the flexible coupling means.

23. The apparatus of claim 21 wherein the flexible coupling means includes a first conductor configured as a vertical-polarized feed line, and a second conductor configured as a horizontal-polarized feed line.

24. The apparatus of claim 21 wherein the first means for radiating radio signals is a backside array and the second means for radiating radio signals is an end-fire array.

25. The apparatus of claim 21 wherein the flexible coupling means is configured to conduct radio frequency signals at frequencies of 60 gigahertz and higher.

* * * * *